US006674332B1

(12) United States Patent
Wunner et al.

(10) Patent No.: US 6,674,332 B1
(45) Date of Patent: Jan. 6, 2004

(54) ROBUST CLOCK CIRCUIT ARCHITECTURE

(75) Inventors: John J. Wunner, Woodinville, WA (US); Galen E. Stansell, Kirkland, WA (US)

(73) Assignee: Cypress Semiconductor, Corp., San Jose, CA (US)

( * ) Notice: Subject to any disclaimer, the term of this patent is extended or adjusted under 35 U.S.C. 154(b) by 0 days.

(21) Appl. No.: 10/236,475

(22) Filed: Sep. 6, 2002

(51) Int. Cl.[7] .................................................. H03L 7/06
(52) U.S. Cl. ............................... 331/18; 331/2; 331/16; 331/25; 327/292
(58) Field of Search .............................. 331/1 A, 2, 16, 331/17, 18, 25, 34; 327/146–150, 156–159, 292, 299; 332/127; 360/51; 375/376; 455/260

(56) References Cited

U.S. PATENT DOCUMENTS

| | | | | |
|---|---|---|---|---|
| 3,769,602 A | * | 10/1973 | Griswold | 331/18 |
| 4,117,405 A | * | 9/1978 | Martinez | 455/502 |
| 4,980,899 A | * | 12/1990 | Troost et al. | 375/357 |
| 5,796,392 A | * | 8/1998 | Eglit | 345/213 |

OTHER PUBLICATIONS

Network Synchronization Clock Family, MK2049 MK2058 MK2059. Timing Solutions For Every Application, pp. 1–8, Integrated Circuit Systems, Inc. 2001.
VCXO–Based Frame Clock Frequency Translator, MK2059–01, a based clock generator, pp. 1–10; Sep. 19, 2001 Revision, Integrated Circuit Systems, Inc.
3.3 V Communications Clock PLL, MK2049–36, a based clock synthesizer, pp. 1–9; Sep. 18, 2001 Revision, Integrated Circuit Systems, Inc.
Communications Clock Jitter Attenuator, MK 2058–01, a based clock jitter attenuator, pp. 1–10: Jul. 10, 2001 Revision, Integrated Circuit Systems, Inc.
Updated Values for External Loop Filter Components and other Useful information, MK2049–34/35/36 Errata, pp. 1–4; Jul. 12, 2001 Revision, Integrated Circuit Systems, Inc.
VCXO–Based Universal Clock Translator, MK2069–04, a based clock generator, pp. 1–19; Nov. 19, 2001 Revision, Integrated Circuit Systems, Inc.
SCG2000 Series Synchronous Clock Generators, pp. 1–20, Rev. AO4, Jan. 29, 2002, The Connor–Winfield Corporation.

* cited by examiner

*Primary Examiner*—David C. Mis
(74) *Attorney, Agent, or Firm*—Okamoto & Benedicto LLP

(57) ABSTRACT

In one embodiment, a first circuit is configured to receive an input reference signal and a feedback signal, and present a reference clock signal based on a difference (e.g., phase difference) between the input reference signal and the feedback signal. The first circuit is further configured to present the reference clock signal even when the reference signal is disrupted. A frequency divider may be employed to scale the frequency of the feedback signal. The reference clock signal may be presented to another circuit to generate one or more output clock signals that are phase-locked to the reference clock signal, for example.

20 Claims, 4 Drawing Sheets

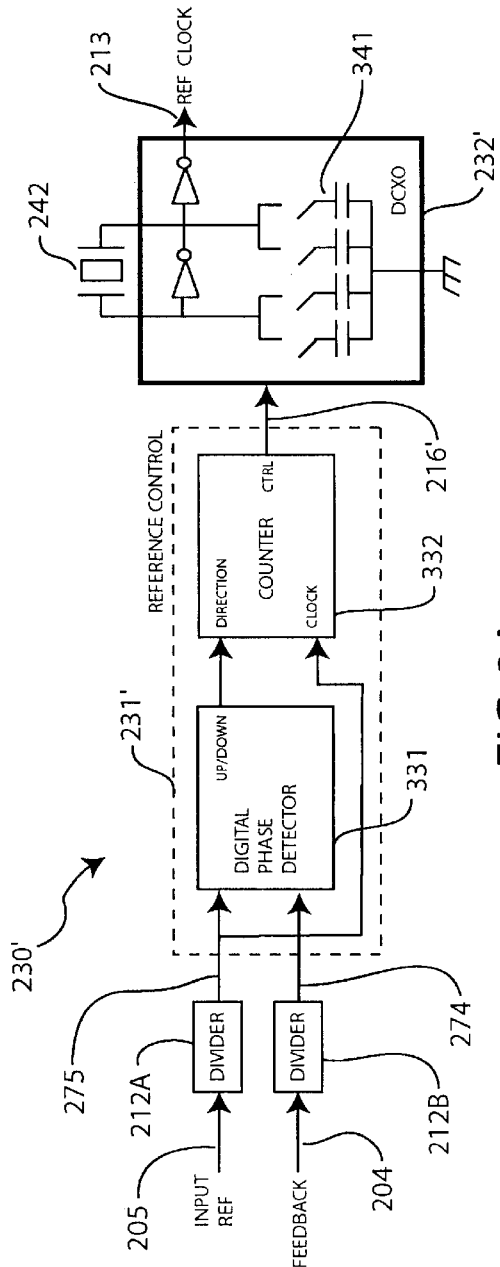
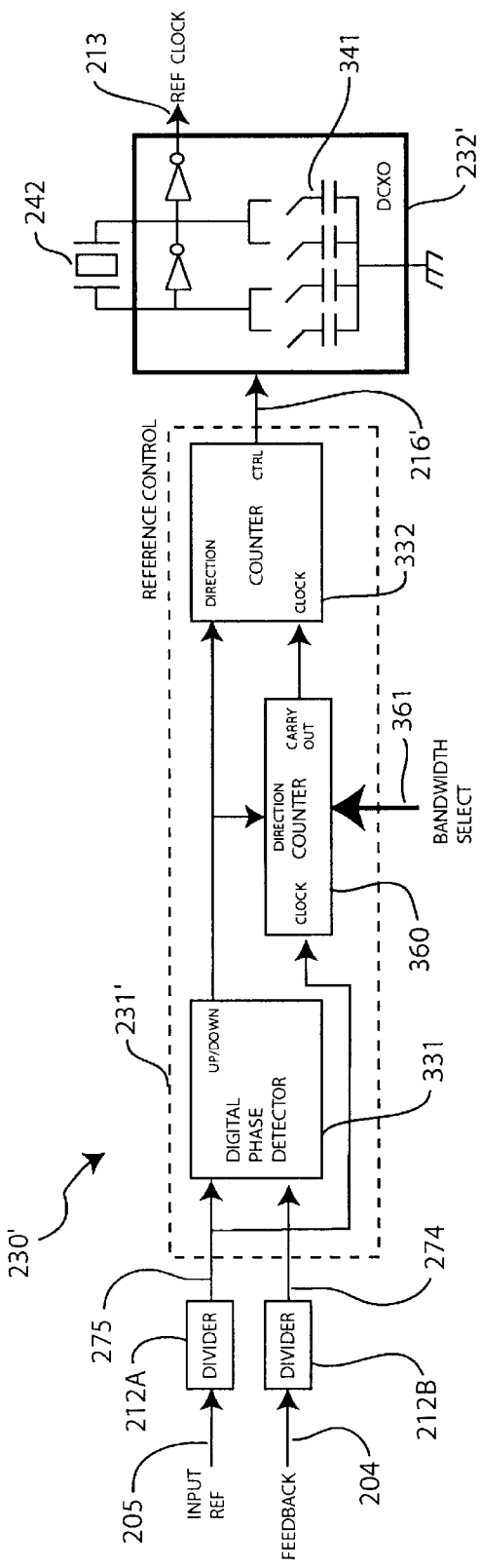
FIG.3A
FIG.3B

ROBUST CLOCK CIRCUIT ARCHITECTURE

BACKGROUND OF THE INVENTION

1. Field of the Invention

The present invention relates generally to electrical circuits, and more particularly but not exclusively to clock circuits.

2. Description of the Background Art

Various types of clock circuits are employed to provide timing information to other circuits. Examples of clock circuits include clock buffers, synthesizers, synchronizers, jitter attenuators, clock generators, clock recovery circuits, and the like. In some applications, one or more clock signals are generated by a clock circuit that is synchronized with an input reference signal. To provide continuous clock signals even when the reference signal is disrupted, some clock circuits include external back-up oscillators that may be used as a replacement for the reference signal. However, the change over from the reference signal to the back-up oscillator may take some time, and may thus result in a momentary glitch or clock signal loss. Also, the use of back-up oscillators may require additional circuitry, such as a multiplexer and a control circuit for switching-in the oscillator. From the foregoing, it is desirable to have a robust clock circuit that may continue to present clock signals even when its reference signal is disrupted. Advantageously, such a clock circuit should also be capable of presenting a clock signal that has a frequency different from that of the reference signal.

SUMMARY

In one embodiment, a first circuit is configured to receive an input reference signal and a feedback signal, and present a reference clock signal based on a difference (e.g., phase difference) between the input reference signal and the feedback signal. The first circuit is further configured to present the reference clock signal even when the reference signal is disrupted. A frequency divider may be employed to scale the frequency of the feedback signal. The reference clock signal may be presented to another circuit to generate one or more output clock signals that are phase-locked to the reference clock signal, for example.

These and other features of the present invention will be readily apparent to persons of ordinary skill in the art upon reading the entirety of this disclosure, which includes the accompanying drawings and claims.

DESCRIPTION OF THE DRAWINGS

FIGS. 3A, 3B, and 3C schematically show digital reference circuits in accordance with embodiments of the present invention.

The use of the same reference label in different drawings indicates the same or like components.

DETAILED DESCRIPTION

In the present disclosure, numerous specific details are provided such as examples of apparatus, circuits, components, and methods to provide a thorough understanding of embodiments of the invention. Persons of ordinary skill in the art will recognize, however, that the invention can be practiced without one or more of the specific details. In other instances, well-known details are not shown or described to avoid obscuring aspects of the invention. For example, circuit details and other circuits that are known in the art or are not necessary to the understanding of the invention have been omitted in the interest of clarity.

Figure 1:
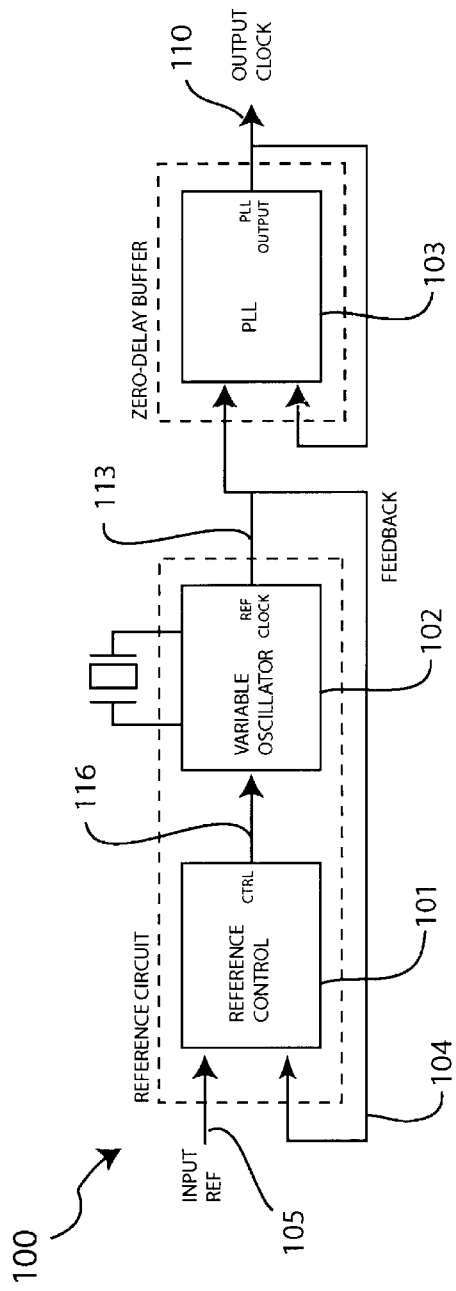
FIG. 1 schematically shows a clock circuit for presenting an output clock signal.

FIG. 1 schematically shows a clock circuit 100 for presenting an output clock signal 110 that may be used as a timing signal for other circuits. Clock circuit 100 includes a reference circuit comprising a reference control circuit 101 and a variable oscillator circuit 102. Clock circuit 100 further includes a zero-delay buffer comprising a phase-locked loop (PLL) circuit 103. Clock circuit 100 may be of the same type as that disclosed in commonly-assigned U.S. application Ser. No. 09/928,818, entitled "FAIL-SAFE ZERO DELAY BUFFER WITH AUTOMATIC INTERNAL REFERENCE", filed on Aug. 13, 2001 by Eric N. Mann and John J. Wunner. U.S. application Ser. No. 09/928, 818 is incorporated herein by reference in its entirety.

Referring to FIG. 1, control circuit 101 presents a control signal 116 that is proportional to the phase difference between reference signal 105 and a feedback signal 104. Based on control signal 116, variable oscillator 102 makes small adjustments to the frequency, and hence the phase, of its output reference clock signal 113. Reference clock signal 113 is fed back to control circuit 101 as feedback signal 104. As can be appreciated, the feedback loop between control circuit 101 and oscillator circuit 102 allows reference clock signal 113 to substantially have the same frequency as and be in phase with reference signal 105.

As shown in FIG. 1, reference clock signal 113 is presented to PLL circuit 103, which in turn presents output clock signal 110. PLL circuit 103 receives output clock signal 110 via a feedback loop, and presents output clock signal 110 such that it is in-phase with reference clock signal 113. Control circuit 101 is configured such that the last value of control signal 116 is held in the event reference signal 105 is disrupted, such as when reference signal 105 is lost or cannot be acquired. This allows variable oscillator 102 to continuously present reference clock signal 113, thus allowing relatively uninterrupted presentation of output clock signal 110.

Although clock circuit 100 is suitable for most applications, clock circuit 100, as depicted in the example of FIG. 1, is not readily adaptable to work with an input reference signal and an output clock signal that have different frequencies. Depending on the application, clock circuit 100 may need a different crystal in oscillator circuit 102 for different combinations of input reference signal and output clock signal frequencies. Such a crystal may have to be a custom-built, and therefore may be relatively expensive. Additionally, the manufacturer of clock circuit 100 may have to stock several crystals with different nominal frequencies.

Figure 2:
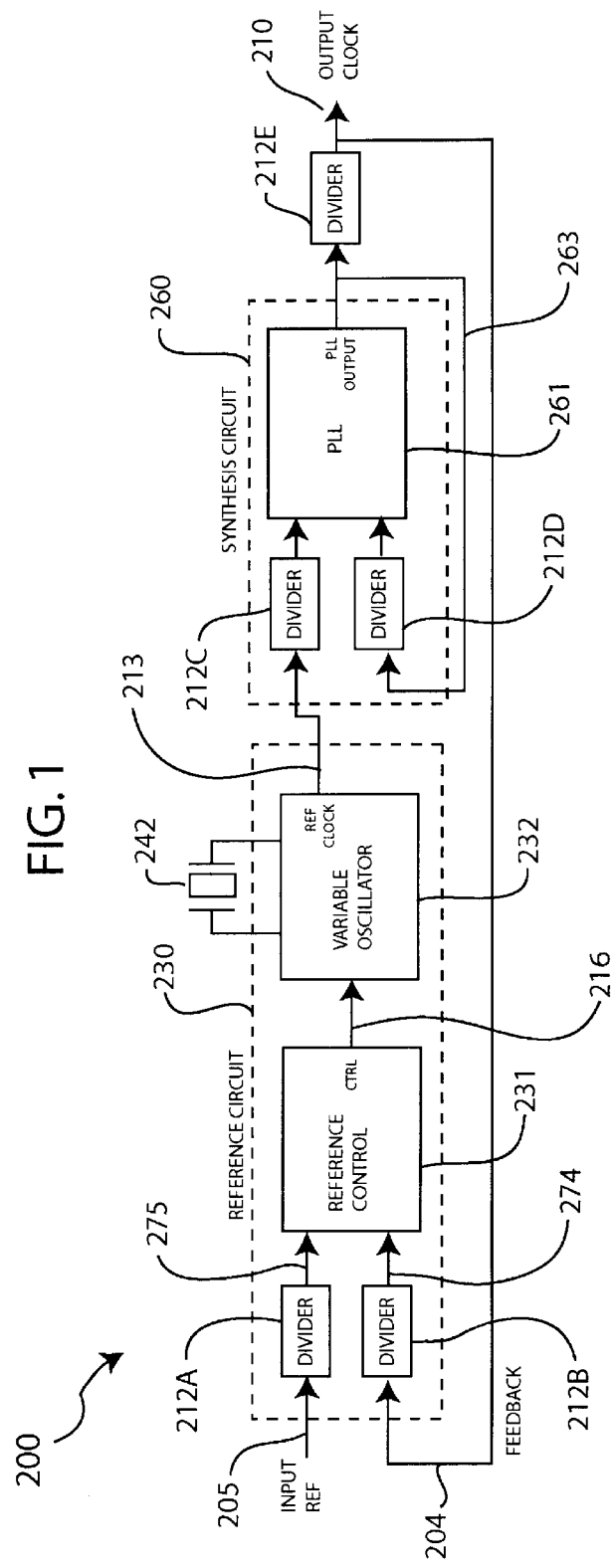
FIG. 2 schematically shows a clock circuit in accordance with an embodiment of the present invention.

Referring now to FIG. 2, there is schematically shown a clock circuit 200 in accordance with an embodiment of the present invention. Clock circuit 200 may include a reference circuit 230 and a synthesis circuit 260. Although circuits 230 and 260 are depicted as two separate circuits, those of ordinary skill in the art reading the present disclosure will appreciate that both circuits, and all other circuits disclosed herein, may be implemented as a single combined circuit or as separate circuits depending on the application. Reference circuit 230 may also be used with circuits other than synthesis circuit 260. Clock circuit 200 is preferably implemented in a single, monolithic integrated circuit chip to advantageously minimize board space requirements. Doing so allows clock circuit 200 to be employed in small electronic devices, such as cellular phones and other portable devices, for example.

Clock circuit 200 may also include frequency dividers 212 (i.e., 212A, 212B, . . . ), some of which may be in reference circuit 230 and synthesis circuit 260. A frequency divider 212 divides the frequency of an incoming signal by an amount referred to as a "divisor". For example, if the divisor of a frequency divider is equal to "2" (i.e., a divide by 2) and the incoming signal has a frequency of 10 kHz, the frequency divider will present a 5 kHz signal that is in-phase with the incoming signal. A divider 212 may be replaced by a wire to divide by 1. Depending on the application, a divider 212 may be implemented as an analog or a digital circuit. In one embodiment, a divider 212 comprises a digitally programmable frequency divider. A programmable frequency divider may be a counter having a modulo that may be set via a register, such as a volatile or non-volatile memory. The modulo may also be set by blowing or setting fuses at the factory or by setting jumper switches, for example. Other types of frequency dividers may also be employed without detracting from the merits of the present invention.

As shown in FIG. 2, reference circuit 230 receives an input reference signal 205 through a divider 212A. The output signal of divider 212A, referred to as "divided input signal 275", is then received by control circuit 231. Divider 212A may be configured to set the sampling rate of control circuit 231. Divider 212A thus allows clock circuit 200 to process a high-frequency input reference signal 205 using low-frequency circuits, thereby allowing for the use of relatively low-cost components in clock circuit 200.

Reference circuit 230 also receives a feedback signal 204 through a divider 212B. The output signal of divider 212B, referred to as "divided feedback signal 274", is then received by control circuit 231. Control circuit 231 presents a control signal 216 that is indicative of a phase difference between divided input signal 275 and divided feedback signal 274. For example, control signal 216 may be proportional to the phase difference between divided input signal 275 and divided feedback signal 274. Control circuit 231 may be configured such that control signal 216 retains its last value in the event reference signal 205 is disrupted. This allows oscillator circuit 232 to present a reference clock signal 213 even when reference signal 205 is lost or cannot be acquired for some reason, for example. When reference signal 205 is re-established, control circuit 231 may once again present control signal 216 based on a phase difference between divided input signal 275 and divided feedback signal 274.

Oscillator circuit 232 may be a voltage controlled crystal oscillator (VCXO) or a digitally controlled crystal oscillator (DCXO) with a pullable crystal 242, for example. As can be appreciated by those of ordinary skill in the art reading the present disclosure, oscillator circuit 232 may also be implemented as a ceramic resonator, saw resonator, LC tank, or like circuits. Oscillator circuit 232 slightly adjusts the frequency of reference clock signal 213 based on the value of received control signal 216. In one embodiment, this is performed by adjusting the nominal frequency of crystal 242 according to the value of control signal 216. As can be appreciated, making small adjustments to the frequency of reference clock signal 213 effectively adjusts its phase.

Still referring to FIG. 2, PLL circuit 261 receives reference clock signal 213 through a divider 212C. Divider 212C may be configured to set the sampling rate of PLL circuit 261. PLL circuit 261 also receives a PLL feedback signal 263, which is an output of PLL circuit 261, through a divider 212D. PLL circuit 261 adjusts its output so that the output signals of dividers 212C and 212D are in-phase. The output of PLL circuit 261 may be presented through a divider 212E as an output clock signal 210. Output clock signal 210 may be employed as a timing signal for other circuits not shown. As can be appreciated, one or more output clock signals 210 may be presented by adding appropriate buffers after divider 212E, for example.

In the example of FIG. 2, feedback signal 204 is taken from the output of divider 212E. As can be appreciated, feedback signal 204 may also be taken from other nodes of clock circuit 200. For example, feedback signal 204 may also be taken from the output of divider 212C or directly from the output of PLL circuit 261. However, taking feedback signal 204 from output clock signal 210 is preferable because it advantageously simplifies the phase relationship between an input reference signal and the resulting output clock signal.

Dividers 212 allow for different output clock signal and input reference signal frequencies. As can be appreciated, output clock signal 210 may have a frequency that is different from that of input reference signal 205 by appropriately configuring dividers 212. For example, after selecting a crystal frequency for oscillator circuit 232, dividers 212D, 212C, and 212E may be configured to set the frequency of output clock signal 210. Thereafter, dividers 212A and 212B may be configured such that divided input signal 275 and divided feedback signal 274 have the same frequency.

Configuring a divider 212 to have a particular divisor will affect the frequency of output clock signal 210. It is to be noted that divisor values for dividers 212 depend on the particular application. Equations 1–6 below provide general guidelines on how to configure dividers 212.

$$Divisor_{212A} = \frac{F_{INPUT\_REF}}{F_{SYNC}} \qquad \text{EQ. 1}$$

$$Divisor_{212B} = \frac{F_{OUT\_CLK}}{F_{SYNC}} \qquad \text{EQ. 2}$$

$$Divisor_{212E} = \frac{F_{PLL}}{F_{OUT\_CLK}} \qquad \text{EQ. 3}$$

$$\frac{Divisor_{212D}}{Divisor_{212C}} = \frac{F_{PLL}}{F_{XIN}} \qquad \text{EQ. 4}$$

$$Divisor_{212C} = \frac{F_{XIN}}{F_{PLLPD}} \qquad \text{EQ. 5}$$

$$Divisor_{212D} = F_{PLL}/F_{XIN} Divisor_{212C} \qquad \text{EQ. 6}$$

In equations 1–6, $Divisor_{212A}$, $Divisor_{212B}$, $Divisor_{212C}$, . . . correspond to the divisors of dividers 212A, 212B, 212C, . . . , respectively. $F_{INPUT\_REF}$ is the frequency of input reference signal 205, $F_{SYNC}$ is the frequency of the output signal of divider 212B, $F_{OUT\_CLK}$ is the frequency of output clock signal 210, $F_{PLL}$ is the frequency of the output signal of PLL circuit 261, $F_{XIN}$ is the nominal frequency of crystal 242, and $F_{PLLPD}$ is the frequency of the phase detector (not shown) of PLL circuit 261. Note that the frequencies of the signals at the inputs of control circuit 231 (i.e., the output of dividers 212A and 212B) are the same, which are equal to $F_{SYNC}$.

As a specific example, a T1 signal having a frequency of 1.544 MHz (i.e., a 1.544 MHz input reference signal) may be converted to an E1 signal having a frequency of 2.048 MHz (i.e., a 2.048 MHz output clock signal) by configuring clock circuit 200 as below:

setting $F_{SYNC}$ to be 8 kHz, $$Divisor_{212A} = \frac{1.544 \text{ MHz}}{8 \text{ kHz}} = 193$$

$$Divisor_{212B} = \frac{2.048 \text{ MHz}}{8 \text{ kHz}} = 256$$

setting $F_{PLL}$ to be 258.048 MHz, $$Divisor_{212E} = \frac{258.048 \text{ MHz}}{2.048 \text{ MHz}} = 126$$

setting Divisor$_{212C}$=1 and Divisor$_{212D}$=14 and using equation 4 to get the crystal frequency, $$F_{XIN} = 258.048 \text{ MHz} \; \frac{1}{14} = 18.432 \text{ MHz}$$

and from equation 5, $$F_{PLLPD} = \frac{18.432 \text{ MHz}}{1} = 18.432 \text{ MHz}$$

In equations 1–6, setting one variable may affect other variables. Selecting which variable to set first will depend on the application and available components. The present invention is not limited to any specific variable value.

Figure 3C:
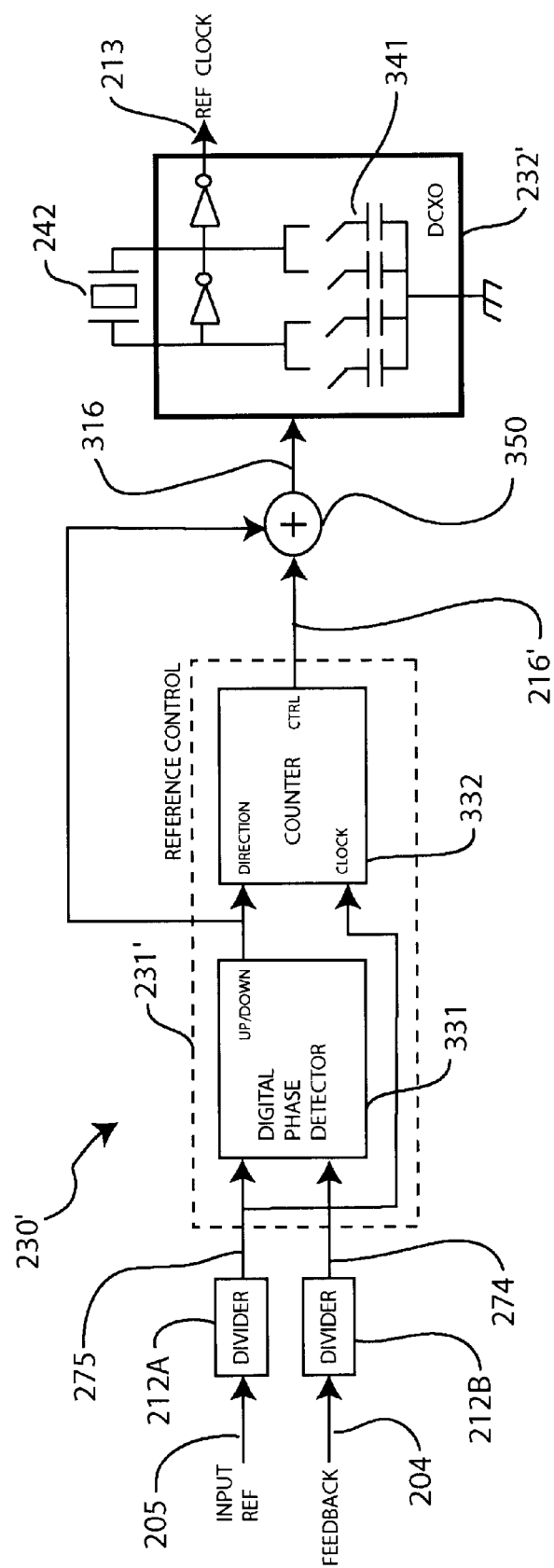

FIG. 3A schematically shows a reference circuit 230' in accordance with an embodiment of the present invention. Reference circuit 230' is a digital implementation of reference circuit 230 shown in FIG. 2. As shown in FIG. 3A, reference circuit 230' may include a reference control circuit 231' and a variable oscillator circuit 232', which are digital implementations of reference control circuit 231 and variable oscillator circuit 232, respectively.

Control circuit 231' may comprise a digital phase detector 331 and a counter 332. Digital phase detector 331 receives input reference signal 205 through divider 212A as divided input signal 275, and feedback signal 204 through divider 212B as divided feedback signal 274. Based on received divided input signal 275 and divided feedback signal 274, digital phase detector 331 presents an "up/down" signal to the direction input of counter 332. The up/down signal indicates whether counter 332 should count up or down when counter 332 detects a pulse of divided input signal 275. Digital phase detector 331 sets the up/down signal to "up" if divided input signal 275 arrives before divided feedback signal 274, and to "down" if divided input signal 275 lags divided feedback signal 274. In one embodiment, counter 332 counts up or down each time an edge of divided input signal 275 is detected. By clocking counter 332 using divided input signal 275, counter 332 will be idle (and will thus hold its last count) when reference signal 205 is disrupted. This allows reference circuit 230' to provide a relatively continuous reference clock signal 213. Advantageously, this provides clock circuit 200 with an automatic fail-safe clock architecture.

Still referring to FIG. 3A, counter 332 increments its count when up/down signal is "up" and a pulse of divided input signal 275 is received, and decrements its count when up/down signal is "down" and a pulse of divided input signal 275 is received. Effectively, counter 332 accumulates count information from digital phase detector 331 and divided input signal 275, and presents the count as control signal 216'. Control signal 216' is a digital implementation of control signal 216 shown in FIG. 2. Control signal 216' may comprise one or more lines representing digital data bits, for example. As can be appreciated, control signal 216' is indicative of the phase difference between divided input signal 275 and divided feedback signal 274. Counter 332 holds the value of the last control signal 216' in the event input reference signal 205 is disrupted. When input reference signal 205 comes back up, counter 332 will resume changing control signal 216' to reflect the phase difference between divided input signal 275 and divided feedback signal 274.

Counter 332 presents control signal 216' to variable oscillator circuit 232', which may comprise a digitally controlled crystal oscillator (DCXO). In one embodiment, oscillator circuit 232' is configured as a Pierce oscillator with a pullable crystal 242 and a capacitor array 341. Capacitor array 341 may be configured to set the frequency of reference clock signal 213. Control signal 216' may be used to tune crystal 242 by selectively coupling one or more capacitors in capacitor array 341 to crystal 242. Generally speaking, coupling-in a capacitor decreases the frequency of reference clock signal 213, thus retarding its phase; coupling-out a capacitor increases the frequency of reference clock signal 213, thus advancing its phase. Capacitor array 341 may be binary weighted to correspond to bits of control signal 216', for example.

As shown in FIG. 3B, reference control circuit 231' may also include a counter 360 for setting the bandwidth of control circuit 231. Counter 360 receives the up/down signal from digital phase detector 331 and is clocked by divided input signal 275. When divided input signal 275 is detected by counter 360, counter 360 increments its count when the up/down signal is "up" and decrements its count when the up/down signal is "down". The number of counts that counter 360 may increment or decrement before asserting its "carry out" signal is configurable by setting bandwidth select 361. In one embodiment, bandwidth select 361 comprises one or more digital data bits that are settable using a non-volatile memory. Bandwidth select 361 may be set for the number of divided input signal 275 pulses that have to be received in one direction before counter 360 asserts its carry out signal. The carry out signal, which may be a count underflow or overflow signal, is presented to the clock input of counter 332. Counter 360 thus effectively limits the bandwidth of reference control circuit 231', allowing control circuit 231' to be readily configured so that it is not too sensitive to slight variations in input reference signal 205. This makes reference circuit 230' specially suitable for applications requiring output clock signals that have relatively low jitter.

As can be appreciated by those of ordinary skill in the art reading the present disclosure, feedback-type circuits, such as a reference circuit, may need some sort of mechanism to stabilize the feedback loop. Various techniques for stabilizing a feedback loop are well known in the art; those of ordinary skill in the art may employ basic control theory to incorporate stability control in any of the embodiments of the present invention. For example, reference circuit 230' may include a feed-forward circuit 350 as shown in the schematic diagram of FIG. 3C. Feed-forward circuit 350 may be an adder, for example. Feed-forward circuit 350 introduces a damping factor to help stabilize reference circuit 230'. In an embodiment where feed-forward circuit 350 is an adder, feed-forward circuit 350 sums the up/down signal from digital phase detector 331 with control signal 216'. The resulting sum, control signal 316, is used to control variable oscillator circuit 232'. Other stability control mechanisms may also be employed without detracting from the merits of the present invention.

Figure 4:
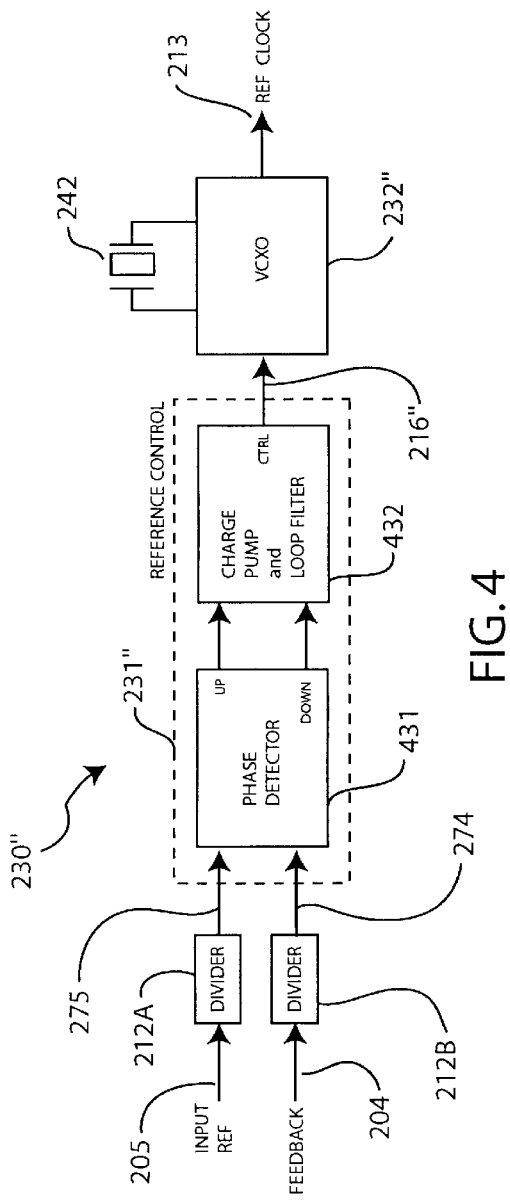
FIG. 4 schematically shows an analog reference circuit in accordance with an embodiment of the present invention.

FIG. 4 schematically shows a reference circuit 230" in accordance with an embodiment of the present invention. Reference circuit 230" is an analog implementation of reference circuit 230 shown in FIG. 2. As shown in FIG. 4, reference circuit 230" may include a reference control circuit 231" and a variable oscillator circuit 232", which are analog implementations of reference control circuit 231 and variable oscillator circuit 232, respectively.

Control circuit 231" may comprise an analog phase detector 431 and a circuit 432. Circuit 432 may comprise a charge pump and a loop filter. Phase detector 431 receives input reference signal 205 through divider 212A as divided input signal 275, and feedback signal 204 through divider 212B as divided feedback signal 274. Phase detector 431 presents an "up" signal and a "down" signal to circuit 432 based on the phase difference between divided input signal 275 and divided feedback signal 274. Circuit 432 increases the voltage of control signal 216" when the up signal is HIGH and the down signal is LOW, and decreases the voltage of control signal 216" when the up signal is LOW and the down signal is HIGH. Phase detector 431 and circuit 432 may be configured such that control signal 216" is proportional to the phase difference between divided input signal 275 and divided feedback signal 274. Note that control signal 216" is an analog implementation of control signal 216.

Oscillator circuit 232" may be a voltage controlled crystal oscillator (VCXO) with a pullable crystal 242. Oscillator circuit 232" presents a reference clock signal 213 based on received control signal 216". That is, oscillator circuit 232" slightly adjusts the frequency, and thus the phase, of reference clock signal 213 according to control signal 216". In the event that reference signal 205 is disrupted, phase detector 431 will cease providing up and down signals to circuit 432, thereby causing the loop filter in circuit 432 to hold the last value of control signal 216". This allows oscillator circuit 232" to continue to present reference clock signal 213 even when reference signal 205 is lost or cannot be acquired, for example. When reference signal 205 comes back up, phase detector 431 will provide up and down signals to circuit 432, thereby resulting in a control signal 216" that is once again proportional to the phase difference between divided input signal 275 and divided feedback signal 274.

Although the components of clock circuit 200 may be implemented using digital or analog techniques, a digital implementation is preferable because the inventors discovered that a digital implementation makes clock circuit 200 specially suitable for low-jitter applications. For example, reference circuit 230' may be readily configured so that it does not react as rapidly to changes in input reference signal 205 compared to reference circuit 230". This allows reference circuit 230' to provide a relatively stable, low-jitter reference clock signal 213. Additionally, unlike an analog implementation, reference circuit 230' does not have to rely on a loop filter to hold the last value of control signal 216'. Specifically, counter 332 may reliably hold the last value of control signal 216' for relatively long periods of time.

Referring back to FIG. 2, reference circuit 230 presents reference clock signal 213 to synthesis circuit 260. Synthesis circuit 260 employs reference clock signal 213 as a reference for PLL circuit 261, which in turn presents an output signal that may be used to generate an output clock signal 210. In the example of FIG. 2, output clock signal 210 is a divided version of the output of PLL circuit 261. As can be appreciated by those of ordinary skill in the art reading the present disclosure, reference circuit 230 may be used to provide a reference clock signal to various types of circuits. One such circuit that may be used with reference circuit 230 is shown in FIG. 5.

Figure 5:
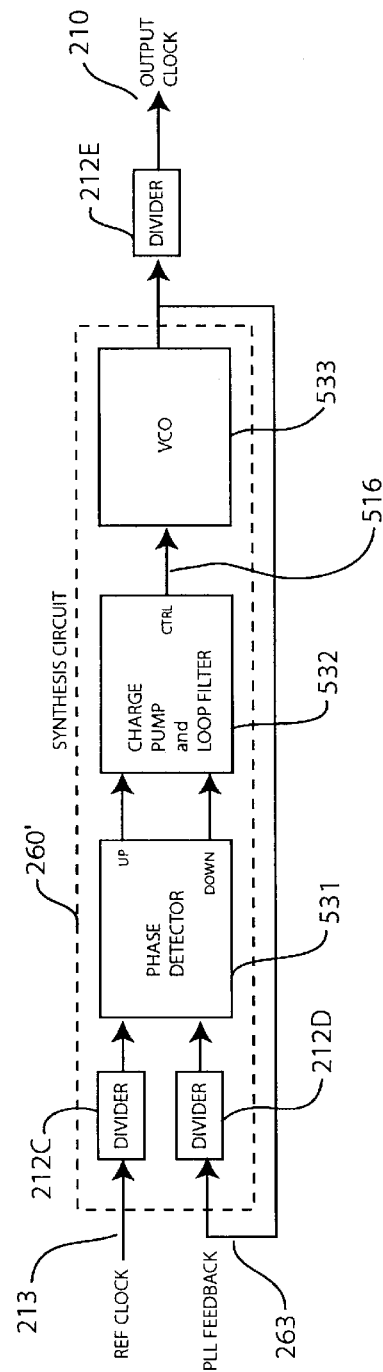
FIG. 5 schematically shows a synthesis circuit in accordance with an embodiment of the present invention.

FIG. 5 schematically shows a synthesis circuit 260' in accordance with an embodiment of the present invention. Synthesis circuit 260' is a specific embodiment of synthesis circuit 260 shown in FIG. 2. Synthesis circuit 260' may include dividers 212C and 212D, analog phase detector 531, circuit 532, and voltage controlled oscillator (VCO) circuit 533. Effectively, phase detector 531, circuit 532, and oscillator circuit 533 form a phase-locked loop circuit.

Phase detector 531 receives reference clock signal 213 through divider 212C and PLL feedback signal 263 through divider 212D. Phase detector 531 presents an "up" signal and a "down" signal to circuit 532 based on a phase difference between the output signals of dividers 212C and 212D. Circuit 532, which may comprise a charge pump and a loop filter, increases the voltage of control signal 516 when the "up" signal is HIGH and the down signal is LOW. Conversely, circuit 532 decreases the voltage of control signal 516 when the "up" signal is LOW and the "down" signal is HIGH. Phase detector 531 and circuit 532 may be configured such that control signal 516 is proportional to the phase difference between the output signals of dividers 212C and 212D.

Variable oscillator 533 may be a voltage controlled oscillator (VCO) that is responsive to control signal 516. Variable oscillator 533 slightly adjusts the frequency, and hence the phase, of its output signal, which is fed back to phase detector 531 as PLL feedback signal 263 and is presented through divider 212E as an output clock signal 210. As can be appreciated, multiple output clock signals 210 may also be presented by incorporating a buffer after divider 212E, for example.

While specific embodiments of the present invention have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. An apparatus comprising:
    a first circuit configured to receive an input signal and a feedback signal and present a reference clock signal based on a difference between the input signal and the feedback signal, the first circuit being configured to continuously present the reference clock signal when the input signal is disrupted; and
    a first frequency divider configured to present the feedback signal.
2. The apparatus of claim 1 wherein the input signal is presented by a second frequency divider.
3. The apparatus of claim 1 wherein the first frequency divider comprises a programmable frequency divider.
4. The apparatus of claim 1 wherein the first circuit comprises:
    a digital circuit coupled to the input signal and the feedback signal and configured to present a digital control signal indicative of the difference between the input signal and the feedback signal; and
    a digitally controlled oscillator configured to present the reference clock signal based on the digital control signal.

5. The apparatus of claim 4 wherein the digital circuit is configured to hold a value of the digital control signal when the input signal is disrupted such that the digitally controlled oscillator continues to present the reference clock signal.

6. The apparatus of claim 4 wherein the reference clock signal is coupled to a phase-locked loop circuit configured to present an output clock signal.

7. The apparatus of claim 4 wherein a bandwidth of the digital circuit is configurable.

8. The apparatus of claim 1 wherein the reference clock signal is coupled to a second circuit configured to present an output clock signal that is in-phase with the reference clock signal.

9. The apparatus of claim 8 wherein the output clock signal is coupled to a second frequency divider.

10. The apparatus of claim 8 wherein the output clock signal is used to present the feedback signal.

11. An apparatus comprising:
   a first circuit means for receiving an input signal and a feedback signal and for presenting a reference clock signal, the first circuit means maintaining the reference clock signal in the absence of the input signal;
   a second circuit means for receiving the reference clock signal and for presenting an output clock signal; and
   a frequency divider means for presenting the feedback signal.

12. The apparatus of claim 11 wherein the first circuit means comprises a digital circuit configured to present a digital control signal that is indicative of a phase difference between the input signal and the feedback signal.

13. The apparatus of claim 11 wherein the second circuit means comprises a phase-locked loop circuit.

14. The apparatus of claim 11 wherein the frequency divider means comprises a programmable frequency divider.

15. A method of providing a clock signal, the method comprising:
   presenting a reference clock signal based on a difference between an input reference signal and a divided feedback signal; and
   continuing to present the reference clock signal when the input reference signal is disrupted.

16. The method of claim 15 wherein presenting a reference clock comprises:
   presenting a digital control signal based on a phase difference between the input signal and the divided feedback signal; and
   tuning a digitally controlled oscillator using the digital control signal.

17. The method of claim 16 wherein a last value of the digital control signal is held when the input signal is disrupted.

18. The method of claim 15 wherein the difference between the input signal and the feedback signal comprises a phase difference determined using a digital phase detector.

19. The method of claim 15 further comprising:
   presenting an output clock signal based on the reference clock signal.

20. The method of claim 19 wherein the feedback signal is derived from the output clock signal.

* * * * *